United States Patent [19]

Chosa

[11] Patent Number: 5,304,249
[45] Date of Patent: Apr. 19, 1994

[54] SUSCEPTER DEVICE FOR THE PREPARATION OF A DIAMOND FILM-COATED BODY

[75] Inventor: Munehiro Chosa, Sodegaura, Japan
[73] Assignee: Idemitsu Petrochemical Company Limited, Tokyo, Japan
[21] Appl. No.: 899,023
[22] Filed: Jun. 15, 1992

Related U.S. Application Data

[62] Division of Ser. No. 705,690, May 24, 1991, abandoned.

[30] Foreign Application Priority Data

May 25, 1990 [JP] Japan .................................. 2-135686
Nov. 22, 1990 [JP] Japan .................................. 2-320147

[51] Int. Cl.$^5$ ............................................. C23C 16/00
[52] U.S. Cl. ..................................... 118/728; 156/612; 156/613; 156/614; 156/DIG. 68; 423/446
[58] Field of Search ....... 156/612, 613, 614, DIG. 68, 156/DIG. 73, DIG. 89; 428/446; 118/728

[56] References Cited

U.S. PATENT DOCUMENTS

| 4,068,814 | 1/1978 | Anthony et al. | 156/DIG. 73 |
| 4,728,389 | 3/1988 | Logar | 156/DIG. 73 |
| 5,148,714 | 9/1992 | McDiarmid | 118/730 |

FOREIGN PATENT DOCUMENTS

| 60-164766 | 3/1985 | Japan . |
| 62-167294 | 7/1987 | Japan . |
| 2-188494 | 7/1990 | Japan . |
| 2-188495 | 7/1990 | Japan . |

OTHER PUBLICATIONS

Abstract of Japanese Patent Reference No. 61-36200 dated Feb. 20, 1986.
Chemical & Engineering News, vol. 67, No. 20, May 15, 1989, pp. 24-39, P. K. Bachmann et al: "Emerging Technology of Diamond Thin Films".
Physical Review B, vol. 38, No. 6, Aug. 15, 1988, USA, pp. 4067-4084; K. Kobashi et al: "Synthesis of Diamonds by Use of Microwave Plasma Chemical-Vapor Deposition Morphology and Growth of Diamond Films".
Applied Physics Letters, vol. 52, No. 20, May 16, 1988, New-York, USA, pp. 1658-1660.; B. Singh et al: "Hollow Cathode Plasma Assisted Chemical Vapor Deposition of Diamond".
Journal Of Applied Physics, vol. 66, No. 10, Nov. 15, 1989, New York, USA, pp. 4676-4684, P. J. Kung et al: "Growth of Diamond Thin Films by Spiral Hollow Cathode Plasma-Assisted Chemical Vapor Deposition".
Patent Abstracts Of Japan, vol. 6, No. 63 (C-99) (941) Apr. 22, 1982, and JP-A-57 3 706 (Hitachi Kasei Kogyo K.K), Jan. 9, 1982.

Primary Examiner—Robert Kunemund
Assistant Examiner—Felisa Garrett
Attorney, Agent, or Firm—Nikaido, Marmelstein, Murray & Oram

[57] ABSTRACT

In forming a diamond film on a surface of substrate by means of plasma method, there is employed in a plasma reacting chamber a supporting member having a top surface for placing the substrate so disposed as to be smaller than a bottom surface of the substrate and having engagement means for engaging with the substrate. When the substrate (particularly substrate for a cutting tool) placed on the top surface of the supporting member is brought into contact with plasma obtainable by exciting raw material gases, a diamond film is coated on the face, land and flank of the substrate for the cutting tool with a uniform film thickness.

27 Claims, 9 Drawing Sheets

—·—DISC-SHAPED SUPPORTING MEMBER
----COLUMN-SHAPED SUPPORTING MEMBER
——TRUNCATED CONE-SHAPED SUPPORTING MEMBER

—·—DISC-SHAPED SUPPORTING MEMBER
----COLUMN-SHAPED SUPPORTING MEMBER
——TRUNCATED CONE-SHAPED SUPPORTING MEMBER

SUSCEPTER DEVICE FOR THE PREPARATION OF A DIAMOND FILM-COATED BODY

This application is a division of application Ser. No. 07/705,690 filed May 24, 1991, now abandoned.

BACKGROUND OF THE INVENTION

1. Field of the Invention

The present invention relates to a method for the preparation of a diamond film-coated body. More particularly, the present invention relates to a method for the preparation of a diamond film-coated body so unlikely to cause flaking and so high in durability as to be suitable for cutting tools and so on. The method encompasses forming a diamond film in a substantially uniform film on a plane surface of a body having a corner portion, such as a cutting tool having a cutting part, and on a portion in a ridge of the corner portion of the body and in the vicinity of the portion of the ridge as well.

2. Description of Related Art

Recently, cutting tools and so on with a diamond film coated thereon have been found to be superior in cutting performance and durability over cutting tools made of superhard alloy. As a result, such diamond film-coated cutting tools capable of cutting for longer periods of time and having longer total cutting tool lives have been sought.

However, unlike conventional cutting tools made of sintered diamond, the cutting tools coated with the diamond film present the problem of durability because flaking may be caused at the cutting parts thereof (i.e., corner portions thereof) due to fatigue.

In addition to the cutting tools, wear-resistant mechanical parts coated with the diamond film likewise have problems with flaking.

As a result of the observation of scars resulting from the flaking of the diamond film from the coated cutting tools, it has been found that in many cases the flaking has occurred at the flank of the cutting tool in the vicinity of the contact point between the cutting part and the cutting work and at the land thereof, not at the contact point.

It is to be noted that the cutting part of the cutting tool so referred to herein means its face, its flank, and a cutting edge intersected by the face and the flank thereof. The corner portions of the cutting tool are subjected to honing, as will be described hereinabove, because ceramics are employed as a substrate for the cutting tools.

In order to solve the problem with flaking as described hereinabove, it is necessary to improve the strength by thickening the film thickness of the diamond film at both the flank and the land of the cutting part as thick as at the face thereof.

To this end, various attempts have been made to coat the diamond film of high quality on a surface of the coating member in a uniform film thickness.

For instance, in a conventional method for coating a diamond film on a body, a body 1 to be coated with a diamond film is placed on a top of disc-shaped or column-shaped supporting member 9 made of h-BN or SiO$_2$ and having a diameter of 2-4 cm, as shown in FIG. 21. As shown in the drawing, a top surface of the supporting member on which the diamond film-coating body is placed is so much larger than a bottom surface of the diamond film-coating body to be coated with the diamond film that, when the diamond film is formed (for example, by means of the microwave plasma CVD method,) plasma spreads over the entire surface of the supporting member on which the diamond film-coating body is placed, thereby creating a large distribution of temperatures and requiring a large magnitude of electric power for charging microwaves. Therefore, a method has been proposed which reduces the surface of the supporting member on which the diamond film-coating body is placed to such an extent that the surface of the supporting member is not smaller than the bottom surface of the body to be coated with the diamond film, as shown in FIG. 22.

As a consequence, plasma spreading over the entire surface of the supporting body can be reduced, thereby decreasing the distribution of temperatures and the requirement for electrical power for charging microwaves. Also, the diamond film can be thickened and the uniformity of the film thickness at the face as indicated by face 8 of cutting part in FIG. 20 can be improved.

However, this method has the difficulty of thickening the diamond film in the vicinity of the contact point in the flank of the cutting tool.

On the other hand, the method using a substrate or a substrate holder, composed of a dielectric body having an exothermic value by microwaves larger at its outer peripheral portion than at its central portion (as described in Japanese Patent Laid-Open Publication (kokai) No. 62(1987)-167,294). This method can improve uniformity in a film thickness of the diamond film.

This process, however, still has the problem of thickening the diamond film in the vicinity of the contact point on the flank of the cutting tool to be coated with the diamond film because the diamond film-coating body is placed on a disc-shaped supporting member.

More recently, methods have been developed which use an accessory member to thereby avoid localization of plasma by the vapor phase method and maintain uniformity in the distribution of temperatures (as described in Japanese Patent Laid-open Publication (kokai) Nos. 2(1990)-188,494 and 2(1990)-188,495). It is to be noted that these methods likewise have the difficulty of making the diamond film thicker on the flank of the diamond film-coating body.

In other words, the conventional methods for the preparation of the diamond film by using various supporting members all have difficulty in thickening the diamond film at the corner portion of the body to be coated with the diamond film.

SUMMARY OF THE INVENTION

The present invention has been achieved under the circumstances as described hereinabove.

The objects of the present invention are to provide a method for the preparation of a diamond film-coated body having a high-quality diamond film so adapted as to enable thickening the diamond film on the flank of the cutting tool to be coated with the diamond film, to improve uniformity of the film thickness and film quality of the diamond film, to improve the resistance to flaking of the diamond film from the diamond film-coating body, and to have high durability.

Another object of the present invention is to provide a method for the preparation of a cutting tool with a diamond film of high quality having improved resistance to flaking by the formation of a diamond film uniform in its film thickness and film quality on the face of a substrate of the cutting tool and on the flank thereof as well, and consequently having excellent durability.

In order to achieve the aforesaid objects, the present invention provides the method for the preparation of the diamond film-coated body characterized by:

placing a diamond film-coating body on a susceptor having a top surface substantially equal to or smaller than a corner portion of a bottom surface of the diamond film-coating body and having engagement means for engaging with a non-corner portion of the diamond film-coating body; and bringing gases obtained by exciting raw material gases containing carbon source gases into contact with a surface of the diamond film-coating body.

DESCRIPTION OF THE PREFERRED EMBODIMENTS

Member to be coated with diamond film

In accordance with the present invention, the body to be coated with the diamond film may be, for example, for various cutting tools, wear-resistant mechanical parts, etc., which are conventional and per se known.

Hence, the body to be coated with the diamond film may be of any shape in accordance with its function. Specifically, it may be of a plate shape, a tip shape (triangular and square), etc.

Preferred as the body to be coated with the diamond film is a substrate for cutting tools. More specifically, the body to be coated with the diamond film suitable for applying to the method according to the present invention is a substrate for a cutting tool of a plane plate shape having a corner portion which functions as cutting part. The shape of the plane plate of the substrate for the cutting tool may be triangular, square or rhombic. The substrate for the cutting tool in a plane plate shape may have a through hole or holes disposed on its plane surface. (Material for the body to be coated with the diamond film)

The material for the body to be coated with the diamond film is not restricted to any particular one and may include, for example, a metal such as silicon, aluminium, titanium, tungsten, molybdenum, cobalt, chromium, etc.; an alloy thereof; an oxide thereof; a nitride thereof; a carbide thereof; a super hard alloy of a WC-Co type, of a WC-TiC-Co type, and of a WC-TiC-TaC-Co type; a cermet of a $Al_2O_3$-Fe type, of a TiC-Ni type, of a TiC-Co type, of a TiC-TiN type, and of a $B_4C$-Fe type; ceramics of a SiAlON type, of a $Si_3N_4$ type, of a $Si_3N_4$-SiC type, and of a $Si_3N_4$-WC type; and a resin. Among those materials, the ceramics of $Si_3N_4$ type, of $Si_3N_4$-SiC type, of $Si_3N_4$-WC type, etc. are preferred.

Supporting member, shape thereof, etc

In accordance with the method of the present invention, the supporting member is arranged to have a top surface on which the body to be coated with the diamond film is to be placed, the top surface having a size substantially equal to or smaller than the corner portions of the body to be coated with the diamond film in accordance with various shapes of the bottom of the body to be coated with the diamond film.

The term "substantially equal to" referred to herein means that the profile of the surface of the supporting member on which the body to be coated with the diamond film is placed is in such a size as failing to project beyond or outside the corner portions of the body to be coated with the diamond film, when viewed from above.

Figure 11:
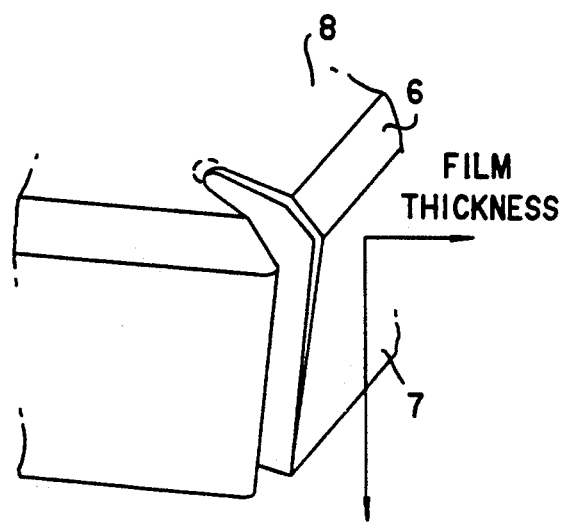
FIG. 11 is a perspective view showing sites at which the film thicknesses of the diamond film are measured in Examples 1 to 4.

For instance, for the body to be coated with the diamond film in a rectangular parallelopiped shape, the corner portions of the body to be coated with the diamond film include an end portion interposed between its upper surface and its adjacent side surface and an end portion interposed between its side surface and its adjacent side surface. Hence, for example, for the cutting tool as shown in FIG. 11, end portions formed by the land 6, in the vicinity of the land on the face, in the vicinity of the land on the flank and by the flank and the adjacent flank constitute the corner portions referred to herein.

Figure 1:
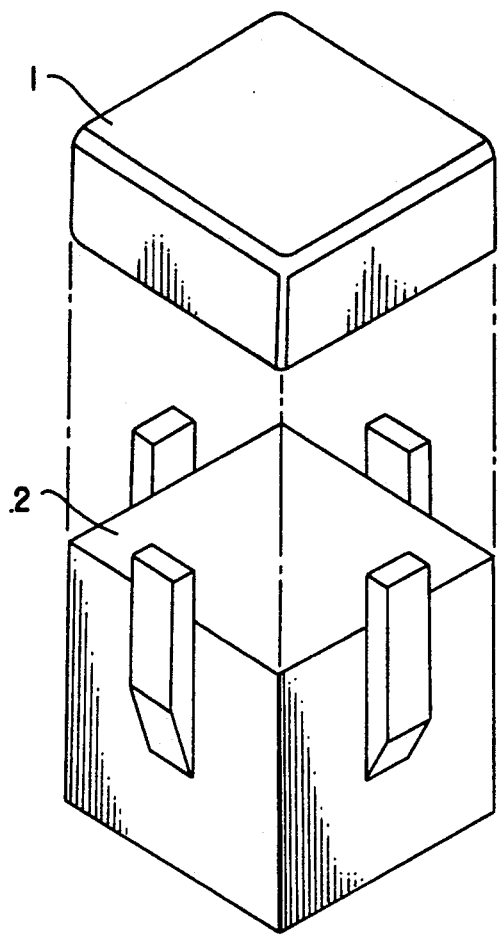
FIGS. 1 to 4 and 6 are diagrammatic representations showing a supporting member to be employed in the method according to the present invention.

Since the supporting member has a top surface for placing the body to be coated with the diamond film in such a shape as to be substantially identical to the bottom surface of the body to be coated with the diamond film at its corner portions, for example, there may be mentioned a supporting member having a top surface 2 of a square shape substantially identical to the square bottom surface of the body to be coated with the diamond film 1, when the body to be coated with the diamond film has a bottom surface in such a square shape as shown in FIG. 1.

Figure 2:
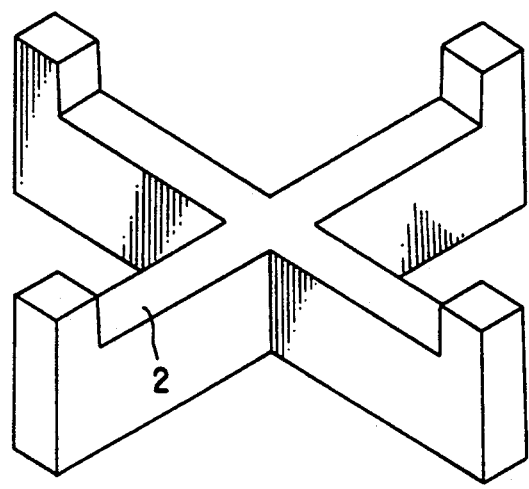

With the surface of the supporting member for placing the body to be coated with the diamond film, which is smaller than the bottom surface of the body to be coated with the diamond film at its corner portions, for example, there may be mentioned a cross-shaped surface 2 having substantially identical dimensions in longitudinal and transverse directions of the bottom surface of the body to be coated with the diamond film 1, when the bottom surface of the body to be coated with the diamond film is a square shape as shown in FIG. 2.

In accordance with the present invention, it is important to make an area of the surface of the supporting body for placing the body to be coated with the diamond film smaller than an area of the bottom surface of the supporting member. The area referred to herein means an area obtained by reflecting the bottom surface of the supporting member on a plane surface parallel to the surface of the supporting member on which the body to be coated with the diamond film is to be placed.

Although the reason for making the surface area of the supporting member for placing the body to be coated with the diamond film smaller than the area of the bottom surface of the supporting member is not thoroughly clarified, it may be considered that, when the area of the surface of the supporting member on which the body to be coated with the diamond film is placed is smaller than the area of the bottom surface of the supporting member, the flow of raw material gases excited by the vapor phase method, as will be described hereinafter, is changed and the excited raw material gases are likely to follow and reach the flank of the body to be coated with the diamond film placed on the surface of the supporting member, thereby allowing the resulting diamond film to be thickened even on the flank of the body to be coated with the diamond film in the same manner as on the land and the face thereof.

The ratio of the area of the surface of the supporting member for placing the body to be coated with the diamond film to the area of the bottom surface of the supporting member may range usually from 1 to 2 to 1 to 20, preferably from 1 to 4 to 1 to 15.

Figure 3:
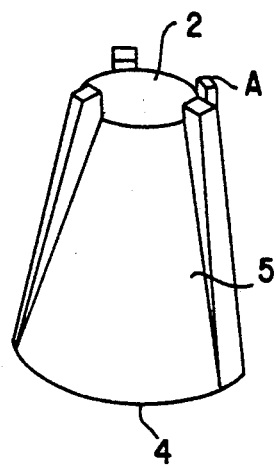
Figure 4:
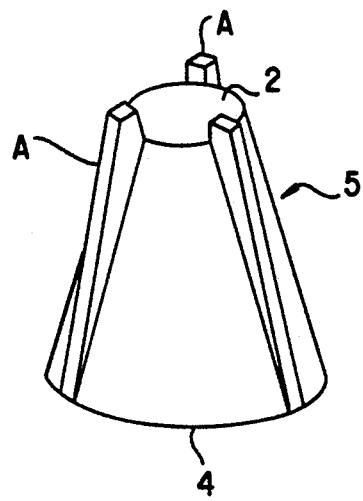

The supporting member to be employed for the present invention is not restricted to any shape as long as it has the surface for placing the body to be coated with the diamond film and the bottom surface as described hereinabove and as will be described hereinafter. Generally speaking, it is preferred that the supporting member is in the form of a truncated cone 5 having a top surface 2 for placing the body to be coated with the diamond film and a bottom surface 4, as shown in FIGS. 3 and 4. In addition to the supporting member in the form of the truncated cone, the supporting member may be in the form of a triangularly truncated pyramid having a triangular top surface for placing the body to be coated with the diamond film thereon. The supporting member can also be in the form of a squarely truncated pyramid having a square top surface for placing the body to be coated with the diamond film thereon in accordance with the shape of the body to be coated with the diamond film, etc. Even if the surface of the supporting member for placing the body to be coated with the diamond film is not in a circular form, it is preferred that the bottom of the supporting member be so circular as to correspond to a conventional reaction tube.

The supporting member to be employed for the present invention may preferably have a side so shaped as to continuously or stepwise expand in an ascending manner from its top surface toward its bottom although its shape is not restricted to any particular type. Hence, the bottom surface of the supporting member is not restricted to a particular one as long as the bottom surface thereof can form a side surface between the top surface and the bottom surface in such a manner as defined in this specification. The supporting member may have a concave cut-away hole at its lower portion so that the bottom surface may be considered as an apparent bottom surface. The side surface of the supporting member to be formed between the top surface and the bottom surface thereof may be flat or curved outwards or inwards. Furthermore, as another example of the supporting member, the supporting member may have a pyramid form at its upper portion and a conical form at its lower portion.

In accordance with the present invention, the area of the bottom surface of the supporting member is not restricted to a particular one and may range from approximately 10 mm by 10 mm to approximately 20 mm by 20 mm, for example, when the supporting member is in the form of a truncated cone and the body to be coated with the diamond film is a throw away tip for a cutting tool. Further, when microwaves are employed as a source of excitation as will be described hereinafter, the diameter of the bottom surface of the supporting member in the form of the truncated cone may preferably range from approximately 30 mm to 45 mm with the fact taken into consideration that an inner diameter of a quartz tube to be employed generally as a reaction tube is approximately 50 mm.

Further, although the height of the supporting member is not restricted to a particular range for the present invention, its upper limit is usually limited by the dimensions of the reaction chamber, etc. On the other hand, it is preferred to set the lower limit to 30 mm or higher in order to change the flow of gases due to the shape of the supporting member, to attain the effect of discharging heat, and so on.

Engagement means of the supporting member

When the body to be coated with the diamond film is placed on the top surface of the supporting member, it is preferred to fix the body to be coated with the diamond film on the top surface using engagement means disposed on the supporting member so as to avoid displacement or sliding.

Although the engagement means is not restricted to any particular type, projections as indicated by reference symbol A in FIGS. 1 to 7 may be mentioned as representative examples.

The projections A are so disposed at the end portions of the supporting member as to project from the top surface 2 of the supporting member for placing the body to be coated with the diamond film and as to allow their inner surfaces to abut with non-corner portions (i.e.) sides other than the corners of the body 1 to be coated with the diamond film. It is to be noted herein that the height of the projections may preferably be set to be lower than the height (thickness) of the body 1 to be coated with the diamond film.

It is further to be noted that the positions in which the non-corner portions of the body to be coated with the diamond film are engaged with the projections of the supporting member are preferably as remote as possible apart from the corner portions on the sides of the body to be coated with the diamond film.

In accordance with the present invention, the projections as the engagement means may be disposed at its end portions of the supporting member and on the top surface thereof as well so as to allow the projection to engage with a hole formed through the body to be coated with the diamond film, such as a tip.

Material for the supporting member

As the material for the supporting member, there may be mentioned a material, such as h-BN or $SiO_2$, which is readily processible, insulating and permeable to microwaves. It is preferred to add a small amount of an electrically conductive material such as graphite, metallic powders, etc. to the insulating material.

It can be noted that the supporting member which has already been employed for the preparation of the diamond film several times can be expected to present the effect of the gases migrating toward the corner portions of the body to be coated with the diamond film more than a fresh supporting member, because the former is somewhat coated with the diamond film such that the plasma is pulled more by the supporting member than the body to be coated.

Thin piece

When the area of the top surface of the supporting member for placing the body to be coated with the diamond film is smaller than the bottom surface of the body to be coated with the diamond film (i.e., when the bottom surface of the body to be coated with the diamond film protrudes from the top surface of the supporting member,) the diamond film can be continuously coated on the bottom surface or back surface of the body to be coated with the diamond film protruding transversely from the top surface of the supporting member, by the vapor phase method, as will be described hereinafter. When the body to be coated with the diamond film is a throw away tip of a cutting tool, for example, there is the risk of breaking or cracking the tip upon mounting to a bite holder if its bottom surface would be irregular as caused by depositing the diamond film. In order to prevent the diamond film-coated body from breaking or cracking, it is preferred to place a thin piece on the top surface of the supporting member for protecting the back surface or bottom surface of the body to be coated with the diamond film and for holding the body in place. This thin piece is to prevent the body to be coated with the diamond film from dropping from the top surface of supporting member so that its thickness is thinner than the height of the engagement means. This thin piece may preferably be made of ceramics, such as h-BN, p-BN, $Si_3N_4$ or the like, Si or a metal. Thin pieces made of p-BN or Si are preferred, for example, when physical strength and microwave losses caused by high dielectric constant are taken into account.

Plasma reacting chamber for placing the supporting member

The aforesaid supporting member is placed in a plasma reacting chamber.

The shape of the plasma reacting chamber is not restricted to any particular type and it may be any as long as it is per se known as a plasma generating chamber. The plasma reacting chamber may usually be a longitudinally long pipe form that allows gases to pass from its upper portion to its lower portion. An antenna horn for transmitting high-frequency waves and a reflective plate so disposed as to be displaceable to and fro and as to be capable of reflecting the high-frequency waves may be disposed so as to interpose the tubular plasma reacting chamber at the site where the supporting member is placed.

The tubular plasma reacting chamber is usually composed of quartz.

Formation of diamond film

The diamond film can be formed in per se known procedures as long as the vapor phase synthesis is employed. The diamond synthesis according to the vapor phase method as will be described hereinafter is usually employed as an appropriate example.

More specifically, it is preferred to form a diamond film on the body to be coated with the diamond film by bringing gases obtainable by exciting raw material gases containing carbon source gases into contact with the body to be coated with the diamond film in the plasma reacting chamber.

The raw material gases may preferably be gases containing carbon atoms, and hydrogen atoms although they are required to contain at least carbon source gases.

Specifically, the raw material gases may include, for example, mixed gases containing the carbon source gases and hydrogen gas.

As desired, the raw material gases may be employed together with a carrier gas such as an inert gas.

As the carbon source gases, there may be employed gases of various hydrocarbons, halogen-containing compounds, oxygen-containing compounds, nitrogen-containing gases, etc. or gases obtainable by gasification of graphite or other carbons.

The hydrocarbons may include, for example, paraffin-series hydrocarbons such as methane, ethane, propane, butane, etc.; olefin-series hydrocarbons such as ethylene, propylene, butylene, etc.; acetylene-series hydrocarbons such as acetylene, allylene, etc.; diolefin-series hydrocarbons such as butadiene, etc.; alicylic hydrocarbons such as cyclopropane, cyclobutane, cyclopentane, cyclohexane, etc.; aromatic hydrocarbons such as cyclobutadiene, benzene, toluene, xylene, naphthalene, etc.; and so on.

The halogen-containing compounds may include, for example, halogenated hydrocarbons such as methane halide, ethane halide, benzene halide, etc.; carbon tetrachloride; and so on.

The oxygen-containing compounds may include, for example, alcohols such as methanol, ethanol, propanol, butanol, etc.; ethers such as methyl ether, ethyl ether, ethyl methyl ether, methyl propyl ether, ethyl propyl ether, phenyl ether, acetal, a cyclic ether (dioxane, ethylene dioxide, etc.), etc.; ketones such as acetone, diethyl ketone, benzophenone, pinacolin, methyl oxide, an aromatic ketone (acetophenone, benzophenone, etc.), a diketone, a cyclic ketone, etc.; aldehydes such as formaldehyde, acetoaldehyde, butylaldehyde, benzaldehyde, etc.; organic acids such as formic acid, acetic acid, propionic acid, succinic acid, butyric acid, oxalic acid, tartaric acid, stearic acid, etc.; acid esters such as methyl acetate, ethyl acetate, etc.; divalent alcohols such as ethylene glycol, diethylene glycol, etc.; carbon monoxide, carbon dioxide; and so on.

As the nitrogen-containing compounds, there may be mentioned, for example, amines such as trimethyl amine, triethyl amine, etc., and so on.

Among those carbon source gases, preferred are paraffin-series hydrocarbons such as methane which is gaseous at room temperature or high in vapor pressure, ethane, propane, etc.; ketones such as acetone, benzophenone, etc.; alcohols such as methanol, ethanol, etc.; and the oxygen-containing compounds such as carbon monoxide, carbon dioxide, etc.. Carbon monoxide is particularly preferred.

The concentration of the carbon source gases in the total gas may usually range from 0.1% to 80% by volume.

The hydrogen constituting the hydrogen gas generates atomic hydrogen when excited.

Although the mechanism is not clarified yet, the atomic hydrogen is considered to show catalytic action of activating the reaction for forming the diamond. Further, it has the action of removing non-diamond components such as graphite, amorphous carbon, etc. which may be deposited together with the diamond.

As means for exciting the raw material gases, there may be mentioned, for example, microwave plasma CVD method, RF plasma CVD method, DC plasma CVD method, in-magnetic field plasma CVD method (containing ECR conditions), heat filament method, heat plasma CVD method, optical CVD method, laser-induced CVD method, flare method, sputtering method, ion beams method, cluster's ion beam method, ion plating method, and so on.

Among these means, various CVD methods are preferred, and the microwave plasma CVD method is more preferred.

A combination of each of those excitation methods with each of the raw material gases, which is particularly suitable for the object of the present invention, is a combination of the microwave plasma CVD method (including the in-magnetic field CVD method) with the mixed gases containing carbon monoxide gas and hydrogen gas.

In the vapor phase method, the temperature of the body to be coated with the diamond film at the time of forming the diamond film thereon may vary with the method for exciting the raw material gases so that it cannot be determined in a uniform manner. However, it may range usually from 300° C. to 1,200° C., preferably from 500° C. to 1,100° C.

If the temperature would be below 300° C., the velocity of depositing the diamond is too slow or crystallinity of the material deposited may be lost.

On the other hand, if the temperature would exceed 1,200° C., the effect expected to comply with such a high temperature cannot be achieved and it is further disadvantageous from the point of view of energy efficiency. Further, the diamond once deposited may be etched.

The reaction pressure under which the diamond film is to be formed may range usually from $10^{-6}$ torr to $10^3$ torr, preferably from $10^{-5}$ torr to 800 torr. If the reaction pressure would be less than $10^{-6}$ torr, on the one hand, the velocity at which the diamond is deposited may be too slow or no diamond may be deposited. If the reaction pressure would be higher than $10^3$ torr, on the other hand, the amount of graphite produced may become too high.

The reaction time may appropriately be determined because the reaction time may vary with the surface temperature of the body to be coated with the diamond film, the reaction pressure, the film thickness required, and so on.

Although the film thickness of the diamond film to be formed in the manner as described hereinabove is not restricted to a particular range because it may vary with uses of the diamond film-coated body on which the diamond film is formed, it may range usually 0.3 micron or higher, preferably from 0.5 micron to 500 microns, more preferably from 1 micron to 100 microns.

As described hereinabove, the diamond film can be formed from the carbon source gases, for example, by the vapor phase synthesis.

The diamond film-coated member thus prepared can be employed appropriately for cutting tools and anti-wear mechanical parts.

The present invention will be described more in detail by way of examples with reference to comparative examples.

EXAMPLE 1

Figure 5A:
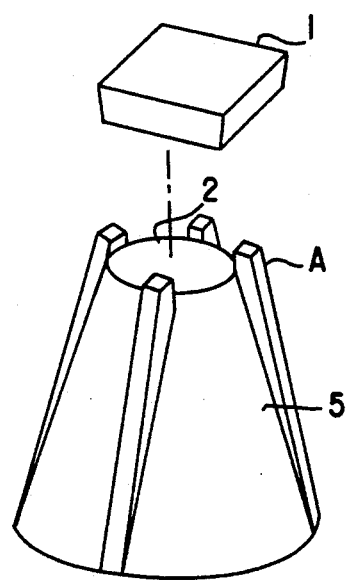
FIGS. 5a–5b are a perspective views showing the way of placing the diamond film-coating body on a supporting member.
Figure 5B:
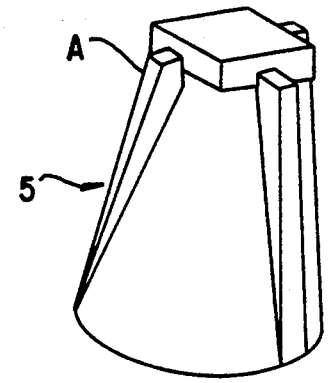
Figure 6:
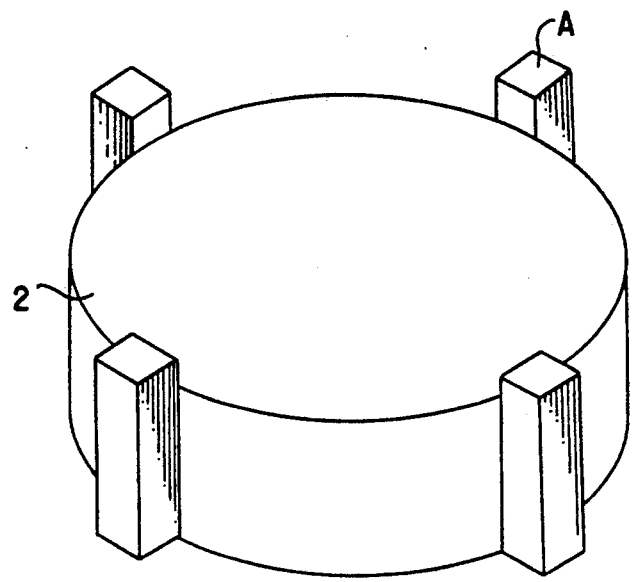
Figure 7:
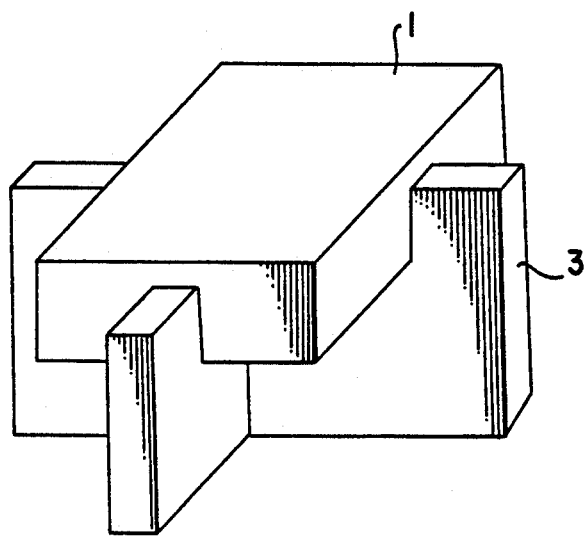
FIG. 7 is a diagrammatic representation showing a state of the body to be coated with a diamond film on the supporting member.
Figure 8:
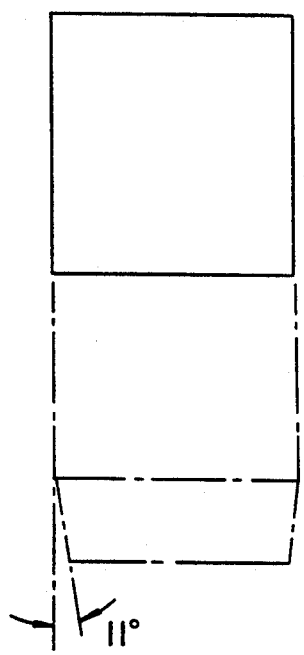
FIGS. 8a–8b are a diagrammatic representations showing the body to be coated with a diamond film to be employed in the embodiment according to the present invention.

A body to be coated with the diamond film 1 ("SPGN120308", a lathe tip made of $Si_3N_4$; FIGS. 8a-8b) was placed on the top surface 2 of a supporting member 3 made of h-BN having four engagement means A, as shown in FIG. 5, in the form of a truncated cone having a diameter for the 12.8 mm of top surface used for placing the body to be coated with the diamond film, a diameter of 35 mm of bottom surface and a height of 40 mm. The body to be coated with the diamond film ("SPGN120308"; a lathe tip made of $Si_3N_4$) 1 was formed as a sectionally trapezoidal shape having a height as high as 3.18 mm and having square upsides, each of the square upsides being as long as 12.7 mm and the square bases, each being shorter than that of the upside, with both sides tapered inwards and downwards from the upside to the base at the angle of 11° to the vertical line, as shown in FIG. 8b.

Figure 9:
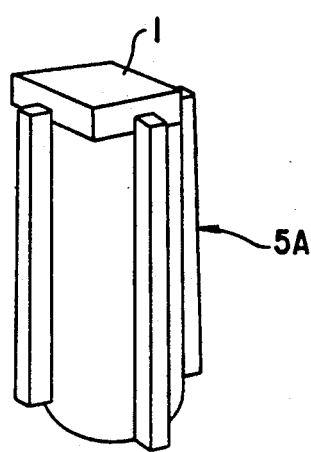
FIG. 9 is a perspective view showing a state of the diamond film-coating body on the surface of the supporting member according to another embodiment of the present invention.

As another supporting member, there was employed a column-shaped supporting member 5A made of h-BN having the diameter of the top surface of 12.8 mm, the diameter of the bottom surface of 12.8 mm, and the height of 12.8 mm, as shown in FIG. 9. On the top surface of the supporting member was placed a body to be coated with the diamond film 1 having the same shape as described hereinabove.

Figure 10:
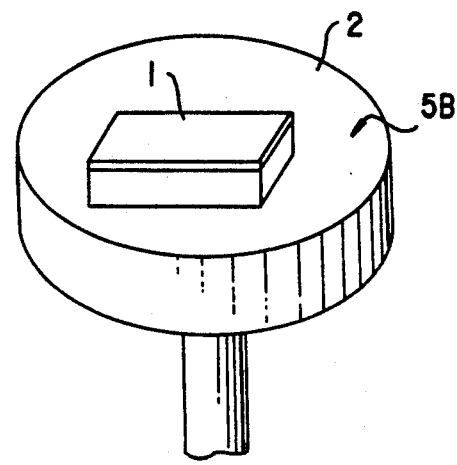
FIG. 10 is a perspective view showing a state of the diamond film-coating body on a surface of a conventional supporting member.

For comparative purposes, there was employed a disc-shaped supporting member 5B made of h-BN having the diameter of its top surface of 35 mm and the thickness of 10 mm, as shown in FIG. 10, and the body to be coated with the film-coat 1 having the same shape as described hereinabove was placed on the top surface thereof.

Thereafter, each of the supporting members was placed in the plasma reacting chamber and the body to be coated with the diamond film was treated with plasma in the plasma reacting chamber under the following reaction conditions:

Reaction conditions

Raw material gases: mixed gases containing carbon monoxide gas (15%) and hydrogen gas (85%)
Flow rate of gases: 100 sccm
Pressure: 40 torr
Temperature: 960° C. (at corner portions of the body to be coated with the diamond film-coating member)
Time: 10 hours
Microwave:

Average charging power: as described in Table 1 below

Frequency: 2.54 GHz

After completion of the reaction, the amount of diamond deposited was measured.

The results are shown in Table 2 below.

TABLE 1

|  | Disc-shaped (FIG. 10) | Cylinder-shaped (FIG. 9) | Truncated cone-shaped (FIG. 5) |
|---|---|---|---|
| Incident wave | 0.50 KW | 0.40 KW | 0.42 KW |
| Reflective wave | 0.05 KW | 0.05 KW | 0.05 KW |

TABLE 2

|  | Disc-shaped | Cylinder-shaped | Truncated cone-shaped |
|---|---|---|---|
| No. of Samples | 24 | 12 | 12 |
| Average increase in Weight (mg) | 12.47 | 11.23 | 14.08 |
| Standard deviation (mg) | 1.04 | 0.84 | 0.63 |

As apparent from Table 1, the average charging power is increasing in order of cylinder-shaped, truncated cone-shaped and disc-shaped and as apparent from Table 2, the amount of the diamond is increasing in order of cylinder-shaped, disc-shaped and truncated cone-shaped.

Figure 12:
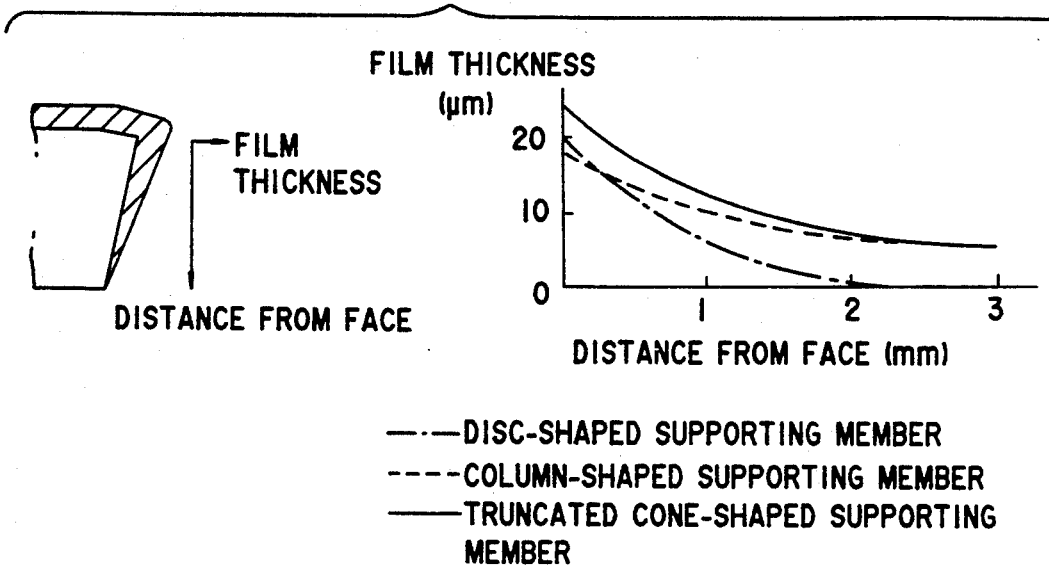
FIGS. 12, 13 and 14 are graphs showing the results of the Examples and Comparative Example.
Figure 13:
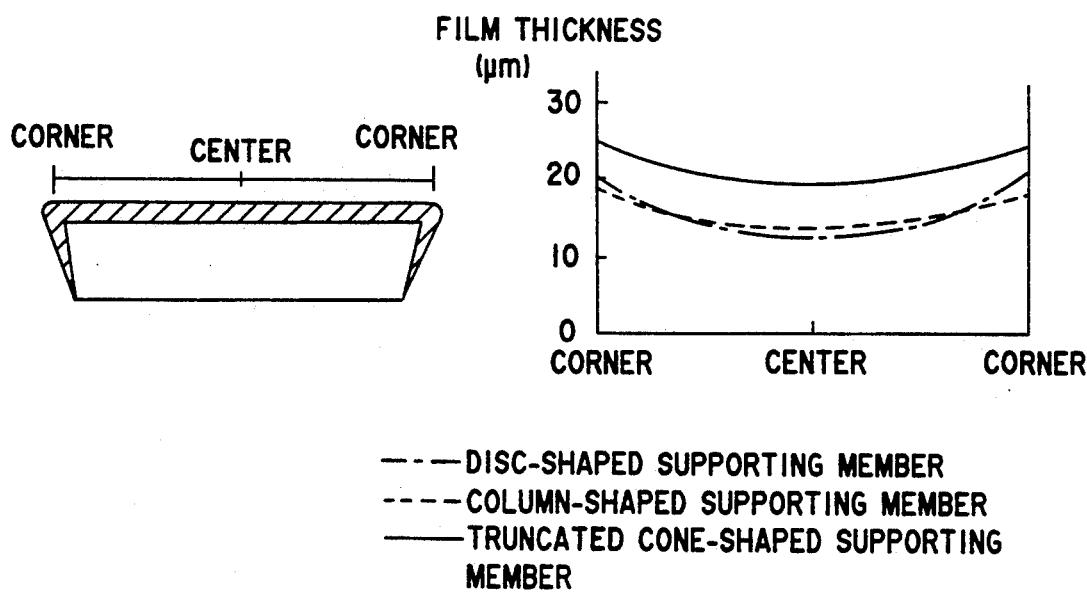

Among sample tips of cutting tools with the diamond film coated thereon, the cutting tools having the amount of the diamond approaching an average value as shown in Table 3 below were cut diagonally by a diamond cutter, as shown in FIG. 11, and the cut surface was observed for the film thickness of the diamond film at the face and flank by scanning electronic microscope. The results are shown in FIGS. 12 and 13.

TABLE 3

|  | Disc-shaped | Cylinder-shaped | Truncated cone-shaped |
|---|---|---|---|
| Increase in Weight (mg) | 12.48 | 11.26 | 14.02 |

As is apparent from those figures, the diamond film can be thickened at the flank of the body to be coated with the diamond film when there were employed the cylinder-shaped supporting member and the truncated cone-shaped supporting member, each having the top surface for placing the body to be coated with the diamond film smaller in area than the bottom surface of the body to be coated with the diamond film, as compared with the use of the disc-shaped supporting member.

In particular, when the truncated cone-shaped supporting member is employed, the diamond film can be thickened more at the flank and face of the body to be coated with the diamond film, as compared with the use of the other supporting members.

EXAMPLE 2

The diamond film was formed under the same conditions using the body to be coated with the diamond film having the same shape and made of the same material as in Example 1, except for disposing a hole having an inner diameter of 3.5 mm, in place of the body to be coated with the diamond film ("SPGN120308"; a lathe tip) employed in Example 1.

As a result, it was found that the amount of the diamond produced was 13.98 mg per piece when the truncated cone-shaped supporting member was employed.

It is further noted that the amounts of the diamond produced were 12.44 mg per piece when the disc-shaped supporting member was employed and 11.25 mg per piece, when the cylinder-shaped supporting member was employed.

EXAMPLE 3

A thin covering piece as indicated by item (a) or (b) was placed on the top surface of the supporting member and the body to be coated with the diamond film was placed on the thin covering piece in order to prevent the diamond film from being continuously formed on the back surface at the corner portions of the body to be coated with the diamond film protruding from the top surface of the truncated cone-shaped supporting member.

For comparative purposes, the body to be coated with the diamond film was placed directly on the top surface of the supporting member (c) without using any covering.

(a) Si plate having a length of 12.7 mm, a width of 12.7 mm and a thickness of 300 microns; and (b) Thermally decomposed BN plate having a length of 12.7 mm, a width of 12.7 mm and a thickness of 1 mm.

(c) No covering.

No formation of any diamond film was recognized on the back surfaces of the body to be coated with the diamond film, each of the items (a) and (b) above when the diamond film-coated body was visually observed after formation of the diamond film.

Further, the corner portions of the diamond film-coated body was cut with a diamond cutter at the site as indicated in FIG. 11, and the sectional cut surface was observed by electron microscope and the film thickness of the diamond film was measured at the flank of the diamond film-coated body.

Figure 14:
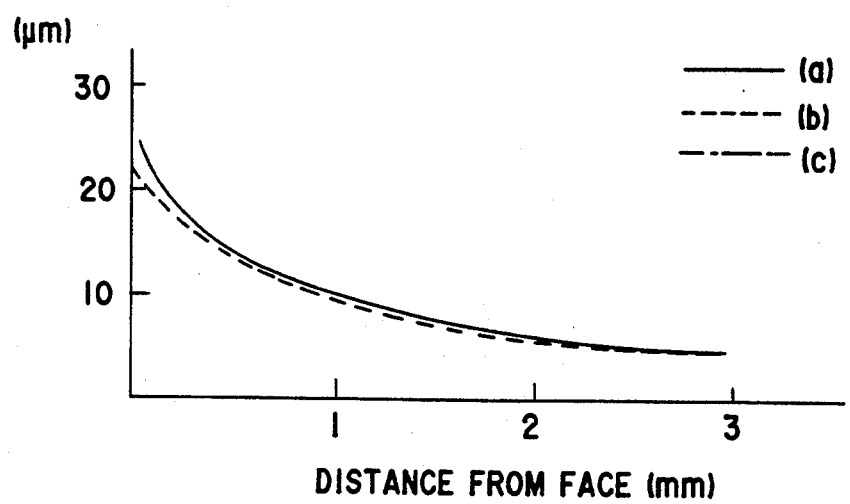

The results are shown in FIG. 14.

Little difference in distribution of film thicknesses was recognized between the items (a), (b) and (c).

Evaluation

From the results of the working examples and comparative examples, the process according to the present invention can provide a diamond film-coated body having homogeneous quality and a uniform film thickness even on the flank of the body to be coated with the diamond film in the same manner as on the face thereof. Consequently, the body to be coated can have a durable diamond film.

In accordance with the present invention, the diamond film can be formed on the body to be coated with the diamond film using the vapor phase method by placing the body to be coated with the diamond film (in particular, for cutting tools) on a supporting member having the top surface smaller in area than the bottom surface of the body to be coated with the diamond film, so that the diamond film can be thickened even on the flank of the body to be coated with the diamond film as well as on the face thereof.

Further, the diamond film formed in the manner as described hereinabove is so uniform and homogeneous in film thickness and in quality that the diamond film is unlikely to cause delamination, thereby yielding a highly durable diamond film-coated body of high quality, particularly useful for cutting tools.

EXAMPLE 4

The diamond film was formed on a body to be coated with the diamond film ("SPGN120408"; a lathe tip made of $Si_3N_4$) in a generally plane and square shape in the same manner as in Example 1, except for the body to be coated with the diamond film had four upsides, each upside being 19.5 mm long and four base sides. Further each side was shorter than the corresponding upside, with the side tapered inside and downwards at the angle of 11° to the vertical line.

By observation of the state of generation of plasma in the plasma generating chamber through an observing window of the plasma generating chamber, it was found that plasma generates so as to envelope the four corners of the tip of a square body. This observation result mean that the four corners, the face and the flank of the tip are in contact with the uniform plasma gas. It is further confirmed that each of the portions of the tip was coated with a uniform film thickness of the diamond film.

On the other hand, substantially the same procedures as above were followed except for the use of the supporting member in a plane plate form as shown in FIG. 10. As a result, the lightening of plasma was observed at the four corners of the tip. This means that the temperatures at the four corners of the tip became extremely high. Further, it was found that the diamond film was irregular in film thickness.

EXAMPLE 5

A body to be coated with the diamond film (SPGN120308; a lathe tip) similar to that used in Example 1, as shown in FIGS. 8a-8b was placed on the top surface of the supporting member made of h-BN in a cross shape as shown in FIG. 2.

The supporting member was placed in advance in the plasma reacting chamber.

The body to be coated with the diamond film was then treated with plasma in the plasma reacting chamber under reaction conditions as follows:

Reaction conditions

Raw material gases: same as in Example 1
Flow rate of gases: same as in Example 1
Pressure: same as in Example 1
Temperature: 1,000° C.
Time: 5 hours
Microwave:
Output of power source: 300 W
Frequency: same as in Example 1

During the reaction, the distribution of temperatures on the body to be coated with the diamond film was measured. It was found that there was little difference in temperatures between the central portion of the top surface and each of upper corner portions of the body to be coated with the diamond film.

Figure 15:
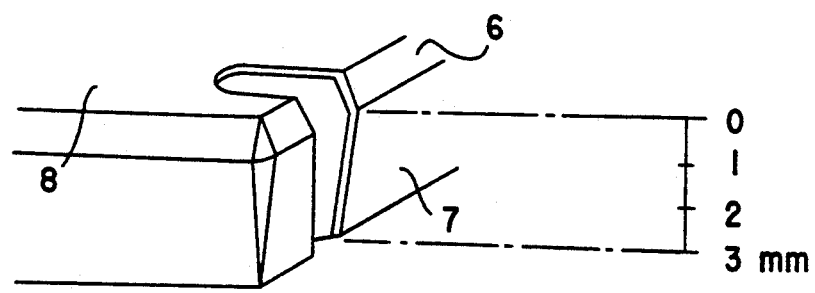
FIGS. 15 is a perspective view showing sites at which the film thicknesses of the diamond film in Example 5 are measured.

After completion of the reaction, the tip for a cutting tool with the diamond film coated thereon was cut with a cutter at the site as shown in FIG. 15. The film thickness of the diamond film on the cut surface was measured by observing the cut surface with an electron microscope.

Figure 16:
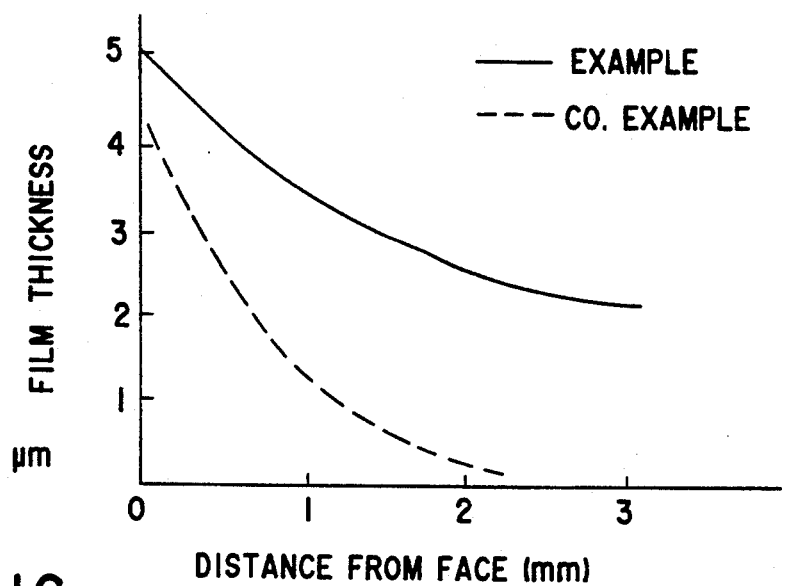
FIG. 16 is a graph showing the results between Example 5 and Comparative Example.

As a result, as shown in FIG. 16, it was found that the diamond film was coated in the film thickness as thick as 2 microns or thicker on the flank in a position apart in distance of 3 mm from the face of the diamond film-coated body. This enables the diamond film to be thickened even in the vicinity of the corner portions of the body to be coated with the diamond film.

Figure 17A:
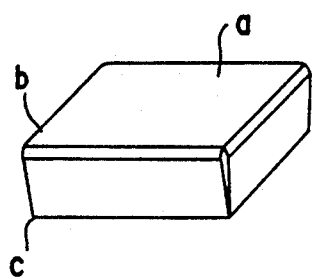
FIGS. 17a–17b show a Raman spectrum of the diamond film formed in Example 5.
Figure 17B:
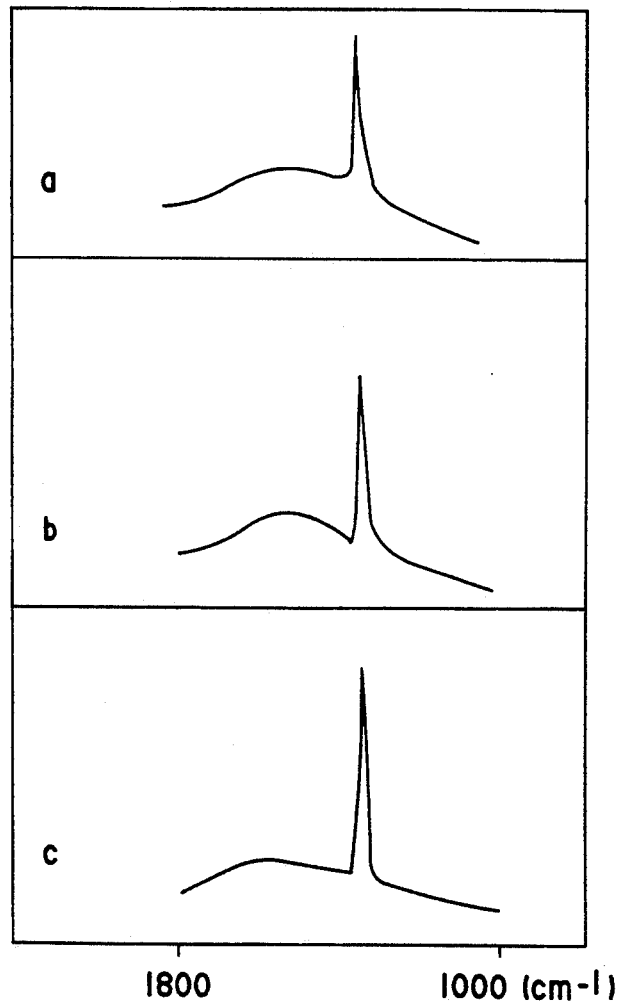

The crystallinity of diamond in the diamond film formed on the face a, the land b and the flank c of the diamond film-coated body, as shown in FIG. 17a, was analyzed by means of Raman spectroscopy. The results are shown at the right-hand portion of FIG. 17b.

The diamond film-coated body thus prepared was employed as a tip a cutting tool and its cutting performance was measured under the following cutting conditions.

Cutting conditions

Type of cutting: Continuously cut by a NC lathe on an exterior peripheral portion in lengthwise direction
Cutting state: Dry
Cutting velocity: 600 meters per minute
Cut depth: 0.25 mm
Feed rate: 0.1 mm/rev.
Work: Al (88%)-Si (12%) alloy AC8A-T6
Number of cut: Four times using the four corners of the tip.

Figure 18:
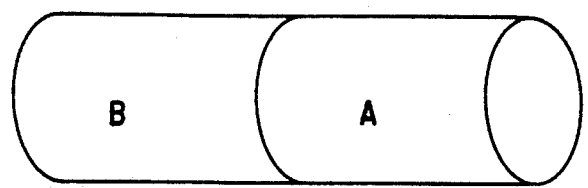
FIG. 18 is a perspective view showing a cutting material employed in Example 5.
Figure 19A:
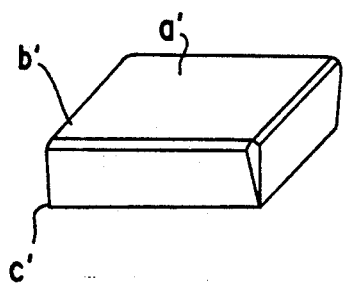
FIGS. 19a–19b, show the Raman spectrum showing the results of the Comparative Example.
Figure 19B:
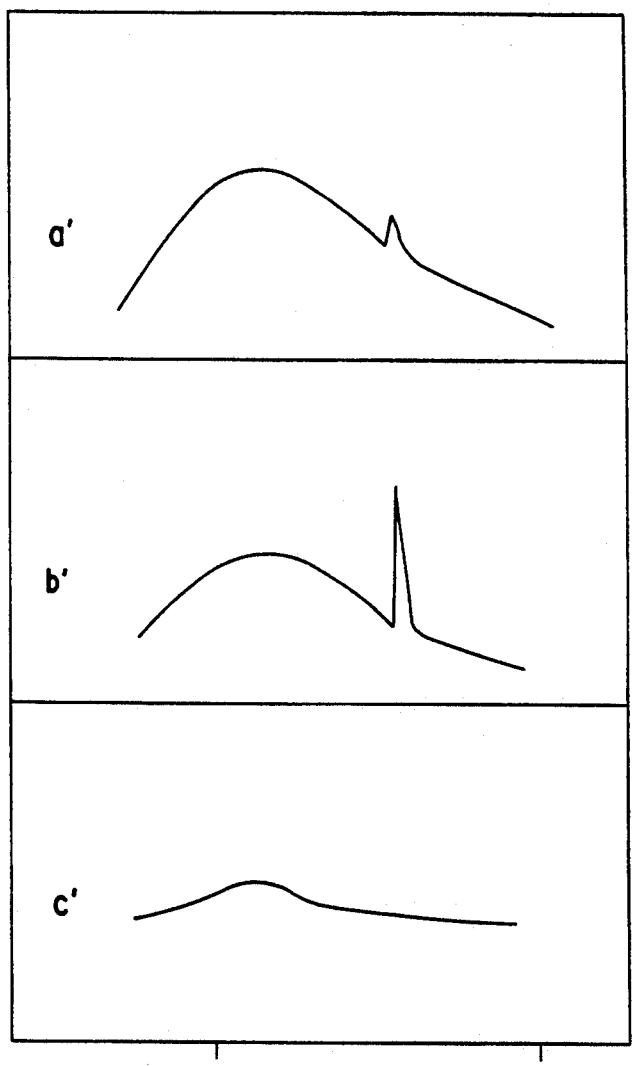
Figure 20:
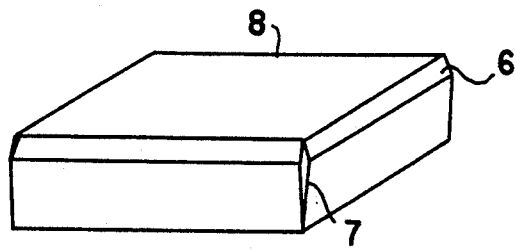
FIG. 20 is a perspective view of the tip of a lathe serving as a member to be coated with the diamond film.
Figure 21:
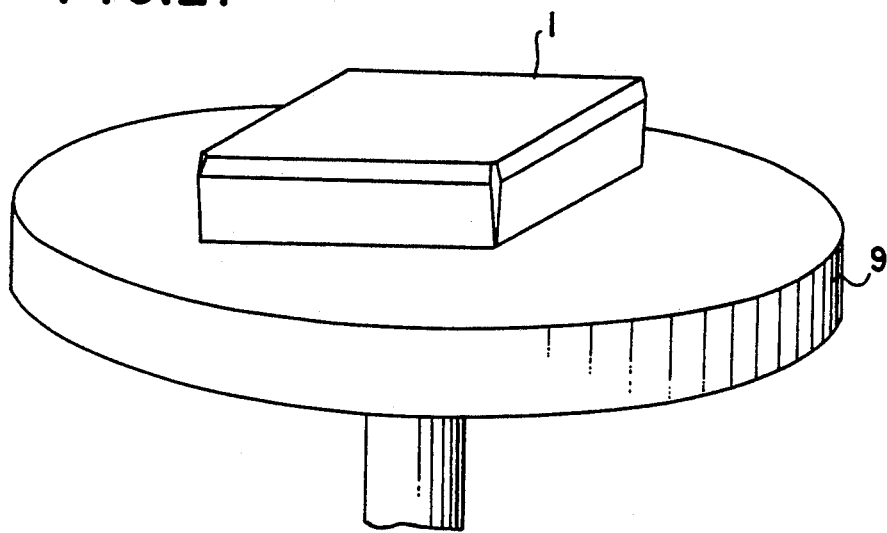
FIGS. 21 and 22 are perspective views showing the state of the diamond film-coating body on the top surface of the conventional supporting members.
Figure 22:
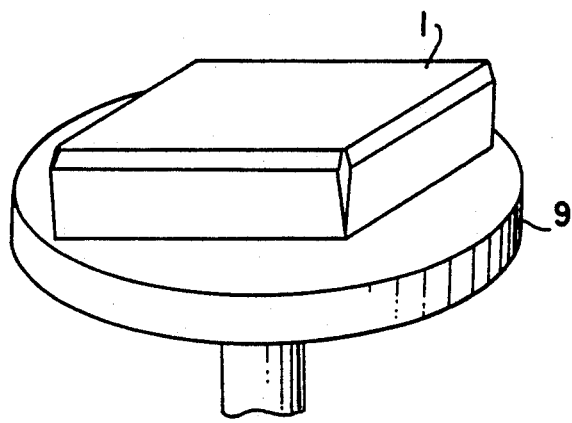

One piece of the work was divided into two pieces as shown in FIG. 18 for comparative analysis with a Comparative Example as will be described hereinafter. The piece A was employed in this example, while the other piece B was employed for comparison as will be described hereinafter.

The results are shown in Table 4 below.

Comparative Example

A tip of cutting tool with diamond film coated thereon was prepared in substantially the same manner as in the foregoing example except for the use of a disc type supporting member having an area of the top surface for placing the body to be coated with the diamond film larger than that of the bottom surface of the body to be coated with the diamond film as shown in FIG. 10 and for the use of microwaves having a power output of 350 W.

The resulting cutting tool tip with the diamond film coated thereon was measured for its film thickness and quality of the diamond film and cutting performance as a cutting tool in the same manner as in the aforesaid example.

The film thickness of the diamond film coated on the cutting tool tip at the corner portions was measured in the same manner as in the aforesaid example.

It was found as a result that little diamond film was formed on the flank in a position apart in distance as short as 2 mm from the face, as shown in FIG. 16, and no coat having film thickness as thick as that obtained in the aforesaid example was formed.

The crystallinity of the diamond film coated thereon was subjected to Raman spectroscopy in the same manner as in the working example as described hereinabove.

As a result, the flank of the tip had no sharp peak resulting from the diamond at 1,333 cm$^{-1}$ at its corner portions, as shown in FIG. 16.

Further, the cutting performance of the cutting tool tip coated with the diamond film thus prepared was measured in the same manner as in the aforesaid example.

The results are shown in Table 4 below.

TABLE 4

| Cutting distance (m) | Corners | Flaking |
| --- | --- | --- |
| Example | | |
| 63,753 | 1 | No |
| 37,790 | 2 | Yes |
| 53,878 | 3 | No |
| 42,167 | 4 | Yes |
| Comparative Example | | |
| 16,947 | 1 | Yes |
| 18,853 | 2 | Yes |
| 25,069 | 3 | Yes |
| 8,072 | 4 | Yes |

Evaluation

From the results of the working examples and comparative examples, it is confirmed that the method according to the present invention using the supporting members as described hereinabove can provide a diamond film that is excellent in uniformity, and unlikely to cause flaking. The diamond film can also be thickened even at corner portions of the body to be coated with the diamond film.

As is apparent from the results of Example 5 and the Comparative Example, it is further confirmed that the present invention provides an industrially useful method for the preparation of diamond film having the following advantages:

1. The use of the supporting member in a particular shape can modify the flow of gases obtainable by exciting raw material gases containing carbon source gases so as to allow the excited gases to follow the corner portions of the body to be coated with the diamond film. The corner portions of the body are allowed to be exposed to the excited gas to a sufficient extent, thereby preventing the resulting plasma from converging and localizing. The supporting member is of such a particular shape that the top surface of the supporting member on which the body to be coated with the diamond film is placed is substantially equal to or smaller in area than the bottom surface of the body to be coated with the diamond film at its corner portions. Also the supporting member has engagement means to allow the non-corner portions of the body to be coated with the diamond film to be engaged with the engagement means.

2. The electric power for the charging microwaves can be lowered and the body to be coated with the diamond film can be heated in a uniform manner, thereby eliminating the distribution of temperatures on the body to be coated with the diamond film.

3. A diamond film-coated body of high durability and quality can be prepared because the diamond film is thickened even at the corner portions of the body to be coated with the diamond film; the diamond film is highly uniform in thickness and quality, and it is unlikely to cause flaking.

What is claimed is:

1. A suscepter for placing a substrate with a diamond film coated on a surface and corner portions thereof, comprising:
    a top surface formed substantially equal to or smaller than a bottom surface of a body having at least one corner portion, so as to allow the body to be coated with the diamond film at its at least one corner portion; and
    engagement means for engaging with non-corner portions of the body to be coated with the diamond film.

2. A suscepter as claimed in claim 1, wherein the body to be coated with the diamond film is a substrate for a cutting tool.

3. A suscepter as claimed in claim 1, wherein the body to be coated with the diamond film is a substrate for a cutting tool having a face, a land and a flank.

4. A suscepter as claimed in claim 1, wherein the suscepter is of such a shape that the suscepter has a sectional area that increases from its top surface to its bottom.

5. A suscepter as claimed in claim 1, wherein the suscepter is of a truncated cone-shaped form having a top surface for placing the body to be coated with the diamond film.

6. A suscepter as claimed in claim 1, wherein the engagement means is formed so as to engage with non-corner portions of the body to be coated with the diamond film and to have a height from the top surface shorter than a thickness of the body to be coated with the diamond film.

7. A suscepter for holding a substrate having at least one corner portion in a diamond film coating device wherein the suscepter holds the substrate during a diamond film coating process, the suscepter comprising:
    a supporting member having a top surface on which the substrate having at least one corner portion is positioned for diamond film coating, the top surface being formed so as to have an area at least one of substantially equal to and less than a bottom surface of the substrate to be diamond film coated at the at least one corner portion of the substrate, and the area of the top surface being shaped substantially the same as the substrate to be diamond film coated; and
    engaging means located on said supporting member, for engaging the substrate during diamond film coating so as to prevent displacement and sliding of the substrate, wherein said engaging means includes a plurality of engagement projections located along an outer periphery of the top surface and projecting upwards relative to and above the top surface so as to engage outer peripheral portions of the substrate only along non-corner portions of the substrate.

8. A suscepter according to claim 7, wherein a ratio of the area of the top surface to the area of the bottom surface of the substrate ranges from 1:2 to 1:20.

9. A suscepter according to claim 8, wherein a ratio of the area of the top surface to the area of the bottom surface of the substrate ranges from 1:4 to 1:15.

10. A suscepter according to claim 7, wherein said supporting member is formed as a truncated cone.

11. A suscepter according to claim 7, wherein said supporting member is formed as a triangularly truncated pyramid.

12. A suscepter according to claim 7, wherein said supporting member is formed as a squarely truncated pyramid.

13. A suscepter according to claim 7, wherein said supporting member is formed as cylinder.

14. A suscepter according to claim 7, wherein said supporting member is formed from h-BN.

15. A suscepter according to claim 7, wherein said supporting member is formed from $SiO_2$.

16. A suscepter according to claim 7, further comprising: separating means positioned between the top surface of said support member and the bottom surface of the substrate, for preventing contact between the top surface and the substrate so as to prevent breaking and cracking of the diamond film coating on the substrate.

17. A suscepter according to claim 16, wherein said separating means is formed of a material at least selected from the group consisting of h-BN, p-BN, $Si_3N_4$, Si and metal.

18. A suscepter according to claim 17, wherein the engagement means includes a plurality of engaging projections located along an outer periphery of the top surface and projecting upwards relative to and above the top surface so as to engage outer peripheral portions of the substrate.

19. A suscepter according to claim 17, wherein the engagement means includes means for engaging outer peripheral portions of the substrate only along non-corner portions of the substrate.

20. A suscepter according to claim 17, wherein a ratio of the area of the top surface to the area of the bottom surface of the substrate ranges from 1:2 to 1:20.

21. A suscepter according to claim 17, wherein a ratio of the area of the top surface to the area of the bottom surface of the substrate ranges from 1:4 to 1:15.

22. A suscepter according to claim 17, wherein the supporting member is formed as a truncated cone.

23. A suscepter according to claim 17, wherein the supporting member is formed as a triangularly truncated pyramid.

24. A suscepter according to claim 17, wherein the supporting member is formed as a squarely truncated pyramid.

25. A suscepter according to claim 17, wherein the supporting member is formed as cylinder.

26. A suscepter according to claim 17, wherein the supporting member is formed from h-BN.

27. A suscepter according to claim 17, wherein the supporting member is formed from $SiO_2$.

* * * * *